US009676615B2

(12) United States Patent
Miao

(10) Patent No.: US 9,676,615 B2
(45) Date of Patent: Jun. 13, 2017

(54) MEMS SILICONE MICROPHONE AND MANUFACTURING METHOD THEREOF

(71) Applicant: MICROLINK SENSTECH SHANGHAI LTD., Shanghai (CN)

(72) Inventor: Jianmin Miao, Shanghai (CN)

(73) Assignee: MICROLINK SENSTECH SHANGHAI LTD., Shanghai (CN)

( * ) Notice: Subject to any disclaimer, the term of this patent is extended or adjusted under 35 U.S.C. 154(b) by 62 days.

(21) Appl. No.: 14/764,811

(22) PCT Filed: Apr. 23, 2015

(86) PCT No.: PCT/CN2015/077281
§ 371 (c)(1),
(2) Date: Jul. 30, 2015

(87) PCT Pub. No.: WO2016/161670
PCT Pub. Date: Oct. 13, 2016

(65) Prior Publication Data
US 2016/0304337 A1  Oct. 20, 2016

(30) Foreign Application Priority Data

Apr. 8, 2015  (CN) .......................... 2015 1 0164691

(51) Int. Cl.
| | |
|---|---|
| *B81C 1/00* | (2006.01) |
| *B81B 3/00* | (2006.01) |
| *H04R 19/00* | (2006.01) |
| *H04R 19/04* | (2006.01) |
| *H04R 31/00* | (2006.01) |

(52) U.S. Cl.
CPC ........ *B81C 1/00158* (2013.01); *B81B 3/0021* (2013.01); *H04R 19/005* (2013.01); *H04R 19/04* (2013.01); *H04R 31/003* (2013.01); *B81B 2201/0257* (2013.01); *B81B 2203/0127* (2013.01); *B81C 2201/0132* (2013.01); *B81C 2203/038* (2013.01); *H04R 2201/003* (2013.01)

(58) Field of Classification Search
CPC . B81C 1/00158; B81B 3/0021; H04R 19/005; H04R 19/04; H04R 31/003
USPC ....................................................... 257/416
See application file for complete search history.

(56) References Cited

U.S. PATENT DOCUMENTS 7,329,933 B2 * 2/2008 Zhe ...................... H04R 31/003
181/164

\* cited by examiner

*Primary Examiner* — Ori Nadav
(74) *Attorney, Agent, or Firm* — Andrew F. Young, Esq.; Lackenbach Siegel, LLP

(57) ABSTRACT

This invention relates to the field of silicon microphone technology, more specifically, to a method for fabricating a MEMS microphone using multi-cavity SOT wafer by Si—Si fusion bonding technology, which comprises a multi-cavity silicon backplate and a monocrystalline silicon diaphragm, both are separated with a layer of silicon dioxide to form the capacitor of the MEMS microphone. The monocrystalline silicon diaphragm has advantages such as low residual stress and good uniformity, which increase the yield and sensitivity of MEMS silicon microphone; the diaphragm comprises tiny release-assistant holes, spring structures with anchors and bumps which can quickly release the residual stress and reduce the probability of stiction between the backplate and the silicon diaphragm. This structure will further improve yield and reliability of MEMS microphone. Therefore, this invention provides simple and reliable process for fabricating MEMS microphones with high sensitivity, good uniformity, excellent reliability and high yield.

5 Claims, 6 Drawing Sheets

MEMS SILICONE MICROPHONE AND MANUFACTURING METHOD THEREOF

CROSS REFERENCE TO RELATED APPLICATIONS

This application relates to and is a national phase application of Ser. No. PCT/CN2015/077281 filed Apr. 23, 2015, the entire contents of which are incorporated by reference, which claims priority from China Ser. No. 201510164691.3 filed Apr. 8, 2015.

BACKGROUND OF THE INVENTION

1. Field of the Invention

The present invention relates to field of silicon microphone, more specifically, to an MEMS silicon microphone and a manufacture method thereof.

2. Description of the Related Art

Microphone converts human voice into a corresponding electrical signal, and is widely used in intelligent terminals like mobile phones, computers, telephones, cameras and camcorders.

Advancement in development of MEMS (Microelectromechanical Systems) technology and process in the last thirty years and so, particularly development of silicon-based MEMS technology, has resulted in miniaturizing a number of sensors with low cost. Started in applications in high-end smart phones, MEMS silicon microphones have found their use broadening over the years in what has become a fast-growing and huge market.

MEMS microphone mainly uses capacitive principle, comprising a diaphragm and a backplate with a few microns of air gap between the two, which forms a capacitor structure. Once the highly sensitive diaphragm senses the external acoustic pressure, the gap between diaphragm and backplate will change, thereby resulting in a capacitance change. The MEMS microphone is connected with a CMOS amplifier and an integrated charging pump for biasing the microphone. The capacitance change will be then converted to a voltage change as an electrical output.

The diaphragm must be thinned down to a specific thickness so that it is very sensitive to the weak human voice signal. Based on the prior art, the fabrication of diaphragm suffers hardly controllable residual stress, significantly affecting the diaphragm sensitivity.

The traditional diaphragm is mainly made of polysilicon or a stack of metal and silicon nitride. Several methods are used to increase the diaphragm sensitivity: first, in case of LPCVD polysilicon film used as diaphragm, an additional annealing process has to be used to adjust the residual stress to a low level; second, for the LPCVD silicon nitride film used as diaphragm, the ratio of reactive gases and deposition temperature are adjusted to reduce residual stress. Unfortunately, all these two methods are not effective and complicated with limited reproducibility; third, the change of diaphragm structure, such as corrugated or floating diaphragm, or the introduction of some small grooves on the diaphragm can also reduce the residual stress and improve sensitivity. However, this kind of methods will result in process complication, cost increase and yield reduction.

Therefore, how to solve the above technical defects becomes a research focus for technical personnel in MEMS microphone field.

SUMMARY OF THE INVENTION

One object of this invention is to overcome the drawbacks in the prior arts and provide a method to fabricate MEMS silicon microphones with simplified manufacturing processes, improved sensitivity, reliability and yield.

The technical solutions for solving the above problems are:

A method for fabricating an MEMS microphone, comprising:

Step 1, providing a diaphragm silicon substrate, and a multi-cavity silicon backplate with a center area and a boundary area surrounding the center area, a plurality of holes being arranged in the multi-cavity silicon backplate;

Step 2, depositing a first dielectric layer on both upper and lower surfaces of the multi-cavity silicon backplate, the first dielectric also layer covering bottoms and sidewalls of the holes, and depositing a second dielectric layer on both upper and lower surfaces of the diaphragm silicon substrate;

Step 3, bonding the lower surface of the diaphragm silicon substrate to the upper surface of the multi-cavity silicon backplate to form capacitor plates of the MEMS microphone;

Step 4, thinning the diaphragm silicon substrate to form a monocrystalline silicon diaphragm of the MEMS microphone;

Step 5, partially etching the monocrystalline silicon diaphragm and stopping the each at the second dielectric layer to form a groove and a plurality of spring structures slots in the boundary areas, and to form a plurality of first through holes and second through holes in the center area, the spring structure slots being located between the groove and the center area;

Step 6, depositing a silicon rich nitride layer which covers bottoms and sidewalls of the second through holes, and covers parts of upper surface of the diaphragm adjacent to the second through holes, so as to form bumps;

Step 7, etching parts of bottom of the groove until the upper surface of the multi-cavity silicon backplate to form an opening, and depositing two metal electrodes in the opening and the boundary area respectively, the two metal electrodes being located at a side opposite to the center area;

Step 8, etching the lower surface of the multi-cavity silicon backplate to form a back cavity exposing the first dielectric layer at the bottoms of the holes;

Step 9, partially removing the first dielectric layer and the second dielectric layer to form a remaining portion on the boundary area to support the monocrystalline silicon diaphragm.

Preferably, the diaphragm silicon substrate is a monocrystalline silicon substrate, or the diaphragm silicon substrate comprises a silicon device layer and a SOI wafer on the silicon device layer.

Preferably, in Step 1, the holes in the center area are formed by DRIE processes.

Preferably, in Step 5, the monocrystalline silicon diaphragm is etched by RIE.

Preferably, Step 6 further comprises:

depositing a silicon rich nitride layer covering upper surface of the second dielectric layer, the upper surface of the monocrystalline silicon diaphragm, and the bottoms and sidewalls of the second through holes, the silicon rich nitride layer filling the spring structure slots and the first through holes;

etching parts of the silicon rich nitride layer to form the remaining portion which is at the bottoms and sidewalls of the second through holes, and covers parts of upper surface of the diaphragm adjacent to the second through holes, so as to form the bumps.

Preferably, Step 7 further comprises:

etching bottom of the groove until the upper surface of the multi-cavity silicon backplate to form the opening;

depositing a metal layer on the monocrystalline silicon diaphragm, the metal layer covering the second dielectric layer and the silicon rich nitride layer, and the metal layer filling the spring structure slots, the first through holes and the opening;

etching parts of the metal layer to remain portions thereof located at the opening and at the upper surface of parts of the monocrystalline silicon diaphragm, the portions forming two metal electrodes which are located at a side opposite to the center area.

An MEMS silicon microphone, comprising:

a multi-cavity silicon backplate and a monocrystalline silicon diaphragm, which act as two plates of capacitor in the MEMS silicon microphone;

a backplate metal electrode being deposited on the multi-cavity silicon backplate, and the backplate metal electrode electrically connecting to the multi-cavity silicon backplate;

a silicon oxide layer being deposited on the multi-cavity silicon backplate, a back cavity and a plurality of acoustic holes being formed in the monocrystalline silicon diaphragm, the plurality of acoustic holes being located above the back cavity, and each of the acoustic holes connecting to the back cavity;

wherein, the monocrystalline silicon diaphragm is located above the multi-cavity silicon backplate and is supported by the silicon oxide layer, a plurality of bumps, spring structures with anchors and tiny release-assistant holes are formed on the monocrystalline silicon diaphragm, a diaphragm metal electrode electrically connecting to the monocrystalline silicon diaphragm is formed on the monocrystalline silicon diaphragm, an air cap is formed between the monocrystalline diaphragm and the multi-cavity silicon backplate, the capacitor in the MEMS silicon microphone is formed by the monocrystalline silicon diaphragm, the multi-cavity silicon backplate and the air gap;

wherein, diaphragm metal electrode on silicon and the backplate metal electrode act as two signal outputs of the capacitor, which are connected with a CMOS amplifier.

Preferably, the bumps are made of silicon rich nitride.

Preferably, the spring structures with anchors surround the bumps and the tiny release-assistant holes.

Preferably, the thickness of the multi-cavity silicon backplate is 400~420 um, and the thickness of the monocrystalline silicon diaphragm is 1~3 um.

This invention has advantages as follows:

This invention shows a method for fabricating a MEMS microphone using multi-cavity SOI wafer by Si—Si fusion bonding technology, which comprises a multi-cavity silicon backplate and a monocrystalline silicon diaphragm, both are separated with a layer of silicon dioxide to form the capacitor of the MEMS microphone. The monocrystalline silicon diaphragm has advantages like low residual stress and good uniformity, which increase the yield and sensitivity of MEMS silicon microphone; the diaphragm comprises tiny release-assistant holes, spring structures with anchors and bumps which can quickly release the residual stress and reduce the probability of stiction between the backplate and the silicon diaphragm. This structure will further improve yield and reliability of MEMS microphone. Therefore, this invention provides simple and reliable process for fabricating MEMS microphones with high sensitivity, good uniformity, excellent reliability and high yield.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

Exemplary embodiments will herein be described in detail with the understanding that the present disclosure is to be considered as an exemplification of the principles of the present invention and is not intended to limit the broad aspect of the invention to the embodiment illustrated.

For overcoming the defects or drawbacks in prior arts, the present invention provides an MEMS silicon microphone and the fabrication method thereof. The technical features of the present invention bring positive effects that the processes for manufacturing MEMS silicon microphone is simplified while the sensitivity, reliability and production yield of MEMS silicon microphone is also improved.

For better understanding purpose, specific steps of the method and specific structures of the production will be described below to illustrate the technical features of the present invention. Some preferred embodiments are described specifically as follows. However, one of ordinary skills should be understood that the present invention may include other embodiments except the below ones.

Figure 3:
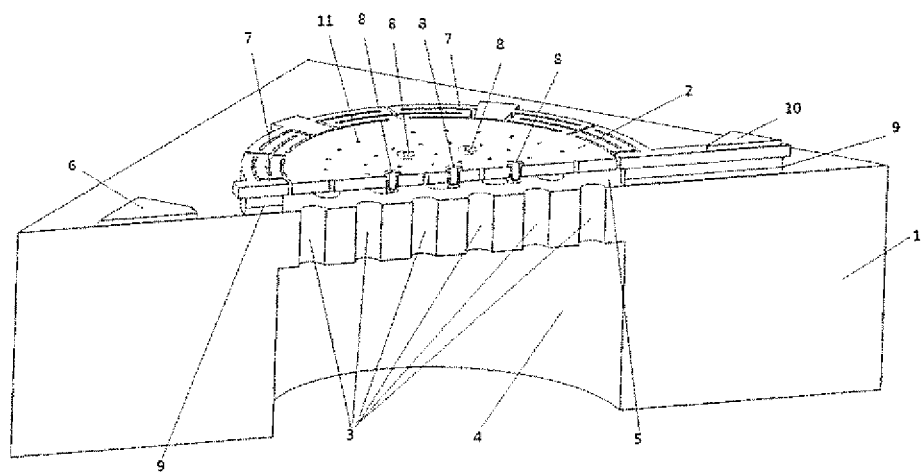
FIG. 3 is a perspective view of the MEMS silicon microphone in the present invention.

Specifically, referring to FIG. 3, the present invention discloses an MEMS silicon microphone comprising a multi-cavity silicon backplate 1, a monocrystalline silicon diaphragm 2, acoustic holes 3, a backside cavity 4, air gap (distance between capacitor plates) 5, a backplate metal electrode 6, spring structure with anchors 7, bumps 8, a silicon dioxide layer 9, a diaphragm metal electrode 10 and tiny release-assistant holes 11.

Figure 1:
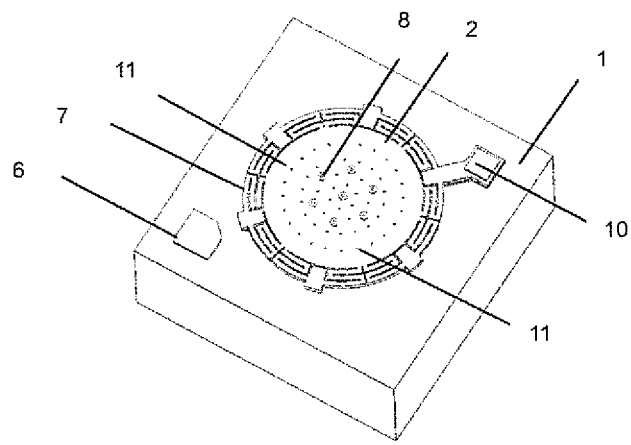
FIG. 1 is the top view of schematic diagram structure of the MEMS silicon microphone in the present invention.

Referring to FIG. 3, which is a section view of the MEMS silicon microphone in the present invention. FIG. 1 is a side view of the MEMS silicon microphone, which comprises a multi-cavity silicon backplate 1, a diaphragm 2 suspending over the multi-cavity silicon backplate 1 and a silicon oxide layer 9 suspending over the multi-cavity silicon for supporting diaphragm 2. The multi-cavity silicon backplate 1 and silicon diaphragm 2 act as two capacitor plates in the MEMS silicon microphone.

Figure 2:
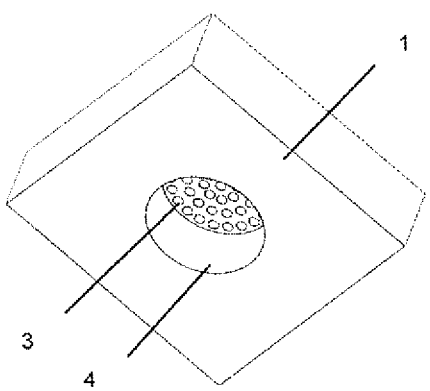
FIG. 2 is the rear view of schematic diagram structures of the MEMS silicon microphone in the present invention.

In this embodiment, the backplate 1 comprises the acoustic holes 3 and the backside cavity 4. The acoustic holes 3 are located above and interconnected with the backside cavity 4. As shown in FIG. 2, the backplate metal electrode 6 covers the backplate 1 and the backplate metal electrode 6 is electrically connected with the backplate 1.

Preferably, the diameter of the acoustic holes 3 is 20~80 μm and the thickness of the backplate 1 is 400~420 μm. The number, size and locations of the acoustic holes are determined according to actual requirements so as to achieve high sensitivity, large frequency range and low acoustic noise.

The diaphragm 2 is formed by a monocrystalline silicon substrate or SOI wafer which has been treated by a thinning process. The diaphragm 2 is of good conductivity and acts as one of the capacitor plates in the MEMS silicon microphone. The silicon diaphragm 2 suspends over the acoustic holes 3 through being supported by the silicon oxide layer 9 on the backplate 1, and forms an air gap 5 between the diaphragm 2 and the backplate 1. The depth of the air gap 5 depends on the thickness of the silicon oxide layer 9. The diaphragm 2 is electrically insulated with the backplate 1 due to the insulating property of the silicon oxide layer 9. The monocrystalline silicon diaphragm 2 comprises a plurality of bumps 8, spring structure with anchors 7 and tiny release-assistant holes 11. The spring structure with anchors 7 surround the bumps 8 and tiny release-assistant holes 11. The bumps 8 can reduce the probability of stiction between the backplate 1 and the diaphragm 2. The tiny release-assistant holes enable the diaphragm to be released rapidly, and the spring structural with anchors enable the diaphragm to release final residual stress, so that process reliabilities and production yields are further improved.

A diaphragm metal electrode 10 is formed on the diaphragm 2. The air gap 5 is located between the diaphragm 2 and the backplate 1. The diaphragm 2, the backplate 1 and the air gap 5 form a capacitor structure of the MEMS silicon microphone.

Preferably, the bumps 8 are made of silicon rich nitride or other insulating material. A thickness of the diaphragm 2 is 1~3 um. The advantages of the monocrystalline silicon diaphragm 2 are low in residual stress and good in uniformity, so that the yield and sensitivity of MEMS silicon microphone are improved.

Preferably, the backplate metal electrode 6 and the diaphragm metal electrode 10 are made of Al or Al—Cu alloy. The diaphragm metal electrode 10 and the backplate metal electrode 6 act as two signal outputs of microphone capacitor plates, which are used for electrical connection with a CMOS amplifier circuit. When the diaphragm has deformation, the capacitance between the backplate and the diaphragm varies. Therefore, the corresponding acoustical signal could be detected by an external CMOS ASIC.

In addition, the invention discloses a method for fabricating the MEMS silicon microphone described above, specifically, steps of the method are shown in FIGS. 4 to 12.

Figure 4:
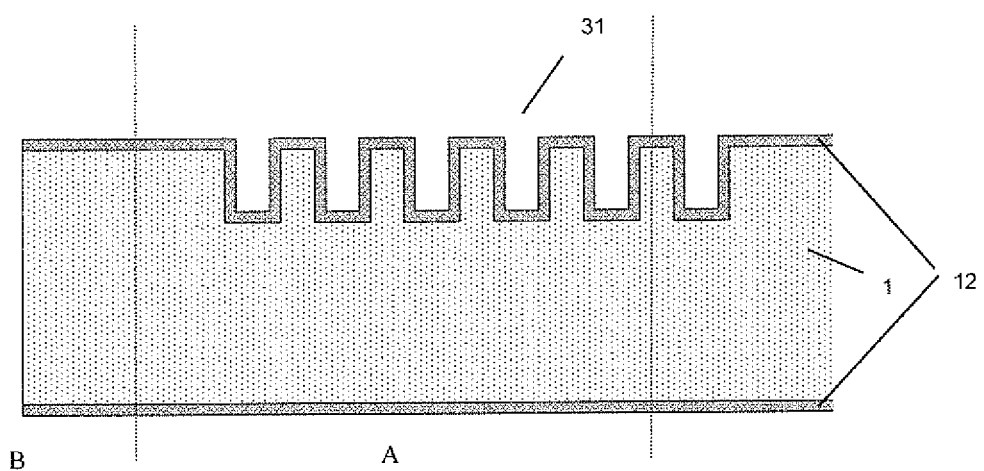
FIGS. 4 to 12 are section views illustrating processes of the manufacture method of the MEMS silicon microphone in the present invention.

The method comprises:

Step 1: Providing a conductive silicon backplate with a center area (Zone A in FIG. 4) and a surrounding boundary area (Zone B in FIG. 4). Preferably, the thickness of the backplate is 400~420 um;

Then forming a plurality of holes 31 spaced from each other on the backplate 1 through performing the DRIE (Deep Reactive Ion Etching) process to the center of the backplate, so as to form a multi-cavity silicon backplate 1 which has the same thickness and structure as the backplate above mentioned; as illustrated in FIG. 4, these holes 31 act as acoustic holes 3 of MEMS silicon microphone. Preferably, the diameter of each of these multi-cavities is 20~80 um.

Likewise, a conductive diaphragm silicon substrate is provided to fabricate monocrystalline silicon diaphragm 2, wherein the conductive diaphragm silicon substrate is a monocrystalline silicon substrate or an SOI wafer with a silicon device layer.

Step 2: Depositing a first dielectric layer (silicon dioxide) 12 covering the surface the multi-cavity silicon backplate as shown in FIG. 4, and depositing a second dielectric layer (silicon dioxide) 13 on the upper and lower surface of silicon diaphragm substrate;

Step 3: Bonding the above-mentioned diaphragm silicon substrate onto the multi-cavities silicon backplate. Specifically, the lower surface of the diaphragm substrate is bonded onto the upper surface of the multi-cavities silicon backplate to seal the multi-cavities;

In Step 3, in case of a monocrystalline silicon substrate is used, the monocrystalline silicon substrate is bonded onto the multi-cavities silicon backplate, i.e., the second dielectric layer 13 (the lower surface of the monocrystalline silicon substrate) is located on the first dielectric layer 12 (the upper surface of the multi-cavities silicon backplate). The second dielectric layer 13 and the first dielectric layer 12 will combine to one dielectric layer 9 (silicon dioxide). In case of an SOI wafer with a silicon device layer is used, the device layer of SOI wafer coated with dielectric layer 13 will be bonded onto the first dielectric layer 12 coated on the upper surface of multi-cavity silicon backplate. These two dielectric layers will combine to one dielectric layer.

The dielectric layer 12 acts as a stop layer for further backside cavity etching process.

Figure 5:
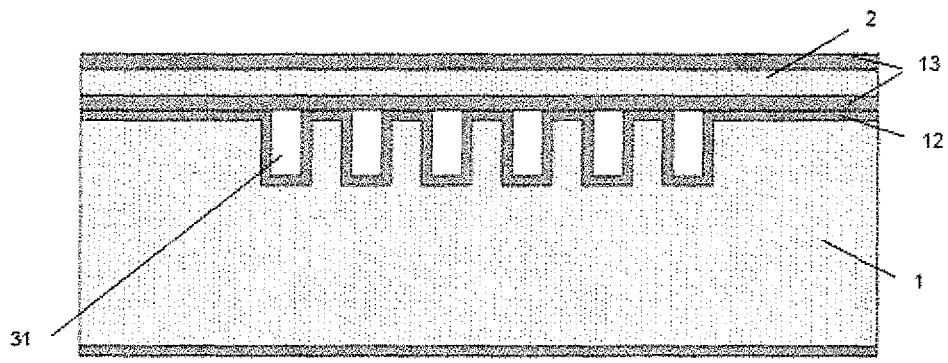

Step 4: Thinning down the diaphragm silicon substrate to a specified thickness to form the monocrystalline silicon diaphragm 2 of the MEMS microphone as shown in FIG. 5;

Preferably, the thickness of the monocrystalline silicon diaphragm is 1~3 um.

Figure 6:
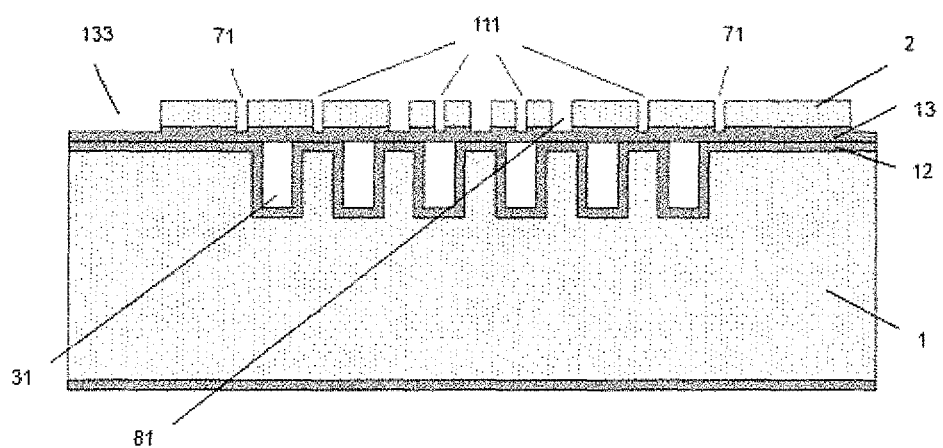

Step 5: Etching the monocrystalline silicon diaphragm through RIE (Reactive Ion Etching) to form the diaphragm shape as shown in FIG. 6.

Specifically, the monocrystalline silicon diaphragm 2 is partially etched and the etch stops at the second dielectric layer 13 to form a groove 133 in the boundary area, spring structure slots 71 in parts of the boundary area, first cavities 111 and the second cavities 81 in the center area; the arc monocrystalline silicon diaphragm near the spring structure slots 71 serves as a spring structures with anchors 7, the first cavities 111 act as tiny release-assistant holes 11, the second cavities 81 act as the outer profile of bumps 8. The spring structure slots are located between the center area and the groove 133.

Figure 7:
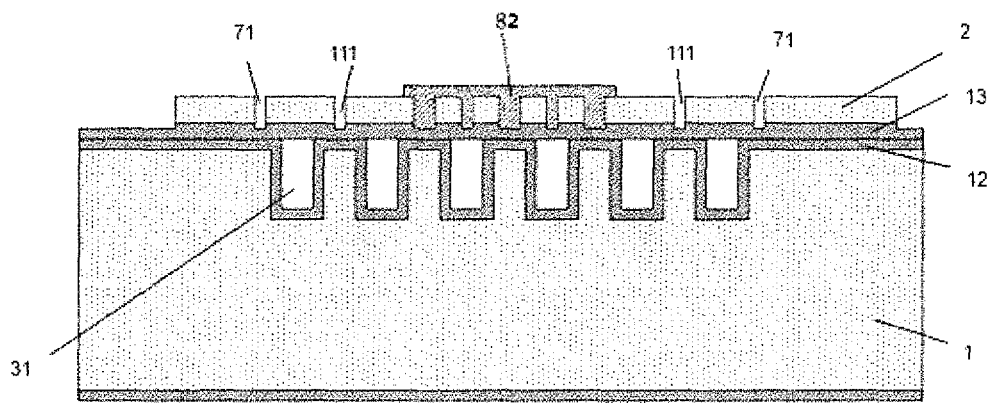
Figure 8:
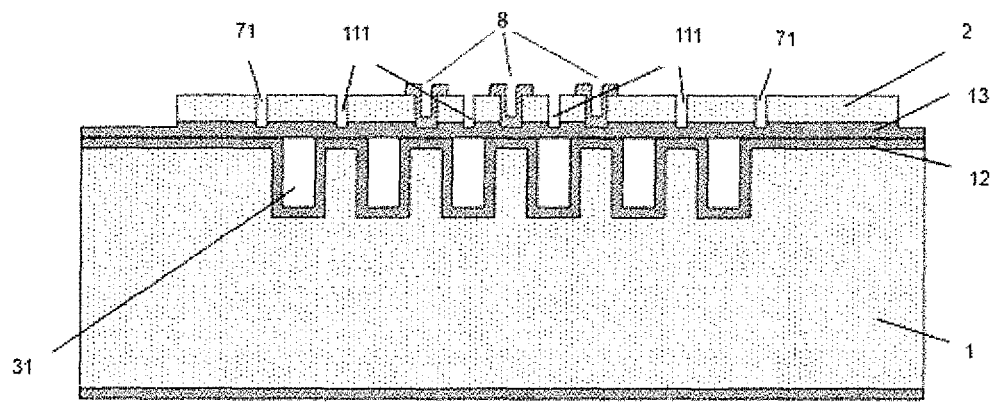

Step 6: Depositing a silicon rich nitride layer 82 (or other dielectric material, the silicon rich nitride 82 is one preferred choice) covering parts of the upper surface of the diaphragm near the second cavities 81, bottoms and sidewalls of the second cavities 81, wherein the silicon rich nitride layer forms the bumps 8 as shown in FIG. 7-8.

In this step, firstly, a silicon rich nitride layer is deposited on the entire upper surface of the monocrystalline silicon diaphragm 2, the upper surface of the second dielectric layer 13, the bottoms of the cavities 81 and the sidewalls of the second cavities 81. The silicon rich nitride layer fills spring structure slots 71 and the first cavities 111;

Then, the silicon rich nitride layer is partially etched and remaining parts of the silicon rich nitride layer are near the second cavities 81, bottoms and sidewalls of second cavities 81, so that bumps 8 are formed.

Step 7: Partially etching parts of the bottom of the groove 133 until the upper surface of the multi-cavity silicon backplate to expose an openning 61; fabricating one metal electrode in the openings 61 and another metal electrode on the monocrystalline silicon diaphragm. These two electrodes are located on the opposite side of the center area.

Figure 9:
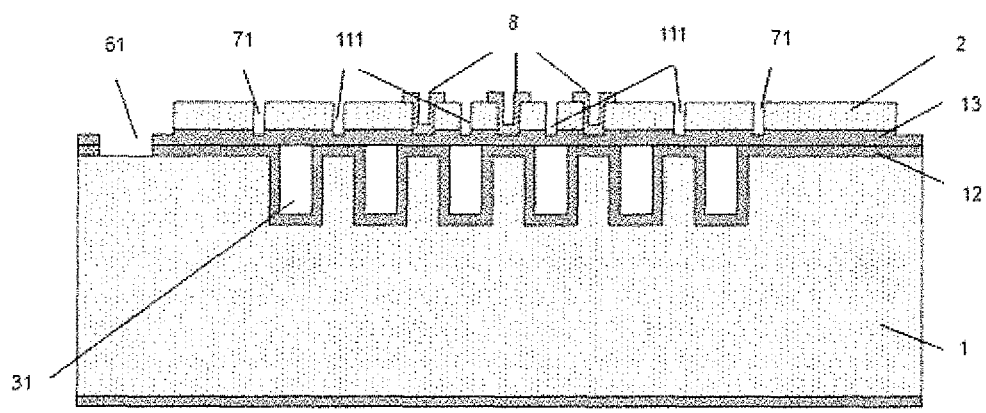

In this step, firstly, parts of bottom of the groove 133 are etched and the etch stops on upper surface of multi-cavity silicon backplate 1 to form the opening 61 as shown in FIG. 9.

Then, a metal layer covering bumps 8, second dielectric layer 13, spring structure slots, first cavities, second cavities and opening 61 is deposited by PVD (Physical Vapor Deposition) on the monocrystalline silicon diaphragm.

Figure 10:
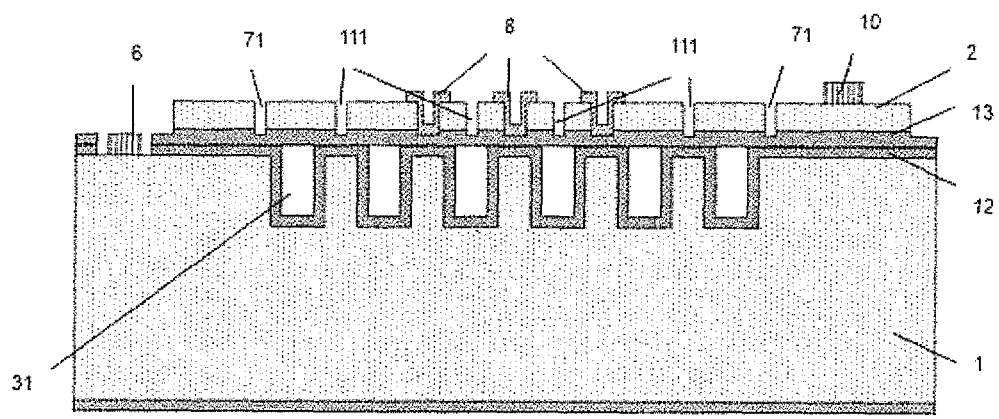

Finally, parts of the metal layer is wet etched to form a backplate metal electrode 6 inside the opening 61 and a diaphragm metal electrode 10 on the upper surface of parts of the monocrystalline silicon diaphragm (these two electrodes are located on the opposite side to the center area), as shown in FIG. 10.

Step 8: etching the lower surface of the backplate 1 to form a backside cavity 4 exposing the first dielectric layer at the bottoms of the holes 31, in other words, etching the lower surface of the backplate 1 and etching the first dielectric layer 12 at the center area, and the etch stops at the bottom of holes 31, so as to form a backside cavity 4 which is at the bottoms of holes 31 and is connected to holes 31 (the first dielectric layer 12 is removed).

Figure 11:
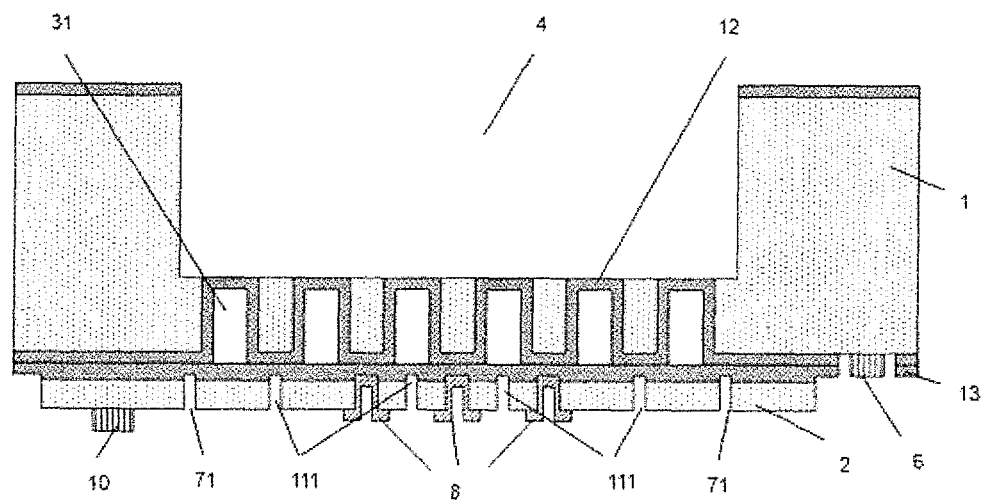

In this step, the FIG. 10 can be placed as an upside-down way to process as shown in FIG. 11. The first dielectric layer 12 at the bottom of the multi-cavity silicon backplate is partially etched to the bottom of holes 31, and the etch stops at the surface of the first dielectric layer 12 at the bottom of holes 31. Therefore, the first dielectric layer 12 acts as a stop layer for this etch. As shown in FIG. 11, the backside cavity 4 locates below holes 31 and is interconnected with holes 31 after removal of the first dielectric layer 12.

Figure 12:
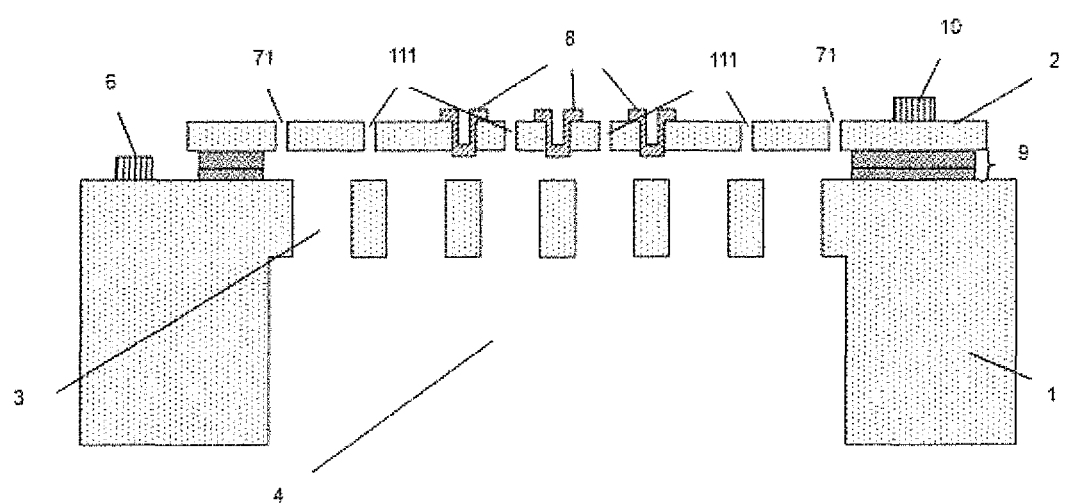

Step 9: Partially removing the first dielectric layer 12 and the second dielectric layer 13 to form a remaining part on the boundary area, so as to support the monocrystalline silicon diaphragm, as shown in FIG. 12. The structure in FIG. 12 corresponds to that in FIG. 3.

In this step, the MEMS silicon microphone fabrication is completed after removing the first dielectric layer 12, the second dielectric layer 13 above the backside cavity 4 and other silicon oxide (such as the first dielectric layer 12 and the second dielectric layer 13 which are below the spring structure with anchors and the tiny release-assistant holes, and so on). After removing the silicon oxide 9 above the backside cavity 4, the air gap 5 is formed, and holes 31 become acoustic holes 3, which interconnect with the backside cavity 4. Silicon dioxide 9 (combination of partial first dielectric layer 12 and partial second dielectric layer 13) is formed after being etched to support the silicon diaphragm 2 floating above the backplate 1, so that the monocrystalline silicon diaphragm is released. The releasing etchant is BOE based chemical or vapor HF.

In this invention, the silicon diaphragm 2 and the silicon backplate 1 act as two capacitor plates of the condense MEMS microphone. When the diaphragm 2 senses the external sound pressure, the diaphragm deformation will occur, resulting in the capacitance change between the backplate 1 and the diaphragm 2. The capacitance change will be then converted to the corresponding electrical signal through a CMOS ASIC chip, which connects to the MEMS microphone chip.

In this invention, the diaphragm is made of a thin and conductive monocrystalline silicon layer or silicon device layer of SOI wafer, which has controllably low residual stress and good uniformity. Furthermore, monocrystalline silicon used as diaphragm material has high mechanical strength, several times higher than the polysilicon, resulting in high resistance against shock and thermal cycling during the reflow soldering process of microphone packaging and in use. The diaphragm and the backplate are made of the same material of monocrystalline silicon with the same coefficients of thermal expansion and can avoid microphone sensitivity change at different environmental temperatures.

In this invention, the acoustic holes 3 are acoustically interconnected to the back cavity 4, which decreases the cost for etching the acoustic holes 3. The diaphragm 2 is made of a thin and highly doped monocrystalline silicon layer which has low residual stress and good uniformity. These properties increase sensitivity and yield of silicon microphones.

The multi-cavity silicon backplate 1 and monocrystalline silicon diaphragm 2 act as two capacitor plates, which further simplifies the process. The silicon dioxide layer 9 ensures an excellent electric insulation between the diaphragm 2 and the backplate 1. The bumps on the diaphragm 2 can avoid the possible stiction between the diaphragm and the backplate during the diaphragm release process and in use. The tiny release-assistant holes help the silicon diaphragm to fast release. The spring structures with anchors help to release the eventually residual stress, resulting in improved yield and reliability.

In conclusion, this invention shows a method for fabricating a MEMS microphone using multi-cavity SOI wafer by Si—Si fusion bonding technology, which comprises a multi-cavity silicon backplate and a monocrystalline silicon diaphragm, both are separated with a layer of silicon dioxide to form the capacitive structure. The monocrystalline silicon diaphragm has advantages like low residual stress and good uniformity, which increase the yield and sensitivity of MEMS silicon microphone; the diaphragm comprises tiny release-assistant holes, spring structures with anchors and bumps which can quickly release the residual stress and reduce the probability of stiction between the backplate and the silicon diaphragm. This structure will further improve yield and reliability of MEMS microphone. Therefore, this invention provides simple and reliable process for fabricating MEMS microphones with high sensitivity, good uniformity, excellent reliability and high yield.

Although a typical embodiment of a particular structure of the specific implementation way has been given with the above description and the figures, it is appreciated that other changes based on the spirit of this invention may also be made. Though the preferred embodiments are proposed above, these contents will never be the limitation of this invention.

It is obvious for the skilled person in the art to make varieties of changes and modifications after reading above descriptions. Hence, the Claims attached should be regarded as all the changes and modifications which cover the real intention and the range of this invention. Any and all equivalent contents and ranges in the range of the Claims should be regarded belonging to the intention and the range of this invention.

What is claimed is:

1. A method for fabricating an MEMS microphone, comprising:

Step 1, providing a diaphragm silicon substrate, and a multi-cavity silicon backplate with a center area and a boundary area surrounding the center area, a plurality of holes being arranged in the multi-cavity silicon backplate;

Step 2, depositing a first dielectric layer on both upper and lower surfaces of the multi-cavity silicon backplate, the first dielectric layer covering bottoms and sidewalls of holes, and depositing a second dielectric layer on both upper and lower surfaces of the diaphragm silicon substrate;

Step 3, bonding the lower surface of the diaphragm silicon substrate to the upper surface of the multi-cavity silicon backplate to form capacitor plates of the MEMS microphone;

Step 4, thinning the diaphragm silicon substrate to form a monocrystalline silicon diaphragm of the MEMS microphone;

Step 5, partially etching the monocrystalline silicon diaphragm and stopping the etch at the second dielectric layer to form a groove and a plurality of spring structure slots in the boundary areas, and to form a plurality of first through holes and second through holes in the center area, the spring structure slots being located between the groove and the center area;

Step 6, depositing a silicon rich nitride layer which covers bottoms and sidewalls of the second through holes, and covers parts of upper surface of the diaphragm adjacent to the second through holes, so as to form bumps;

Step 7, etching bottom of the groove until the upper surface of the multi-cavity silicon backplate to form the opening;

depositing a metal layer on the monocrystalline silicon diaphragm, the metal layer covering the second dielectric layer and the silicon rich nitride layer, and the metal layer filling the spring structure slots, the first through holes and the opening;

etching parts of the metal layer to remain portions thereof located at the opening and at the upper surface of parts of the monocrystalline silicon diaphragm, the portions forming two metal electrodes which are located at a side opposite to the center area;

Step 8, etching the lower surface of the multi-cavity silicon backplate to form a back cavity exposing the first dielectric layer at the bottoms of holes;

Step 9, partially removing the first dielectric layer and the second dielectric layer to form a remaining portion on the boundary area to support the monocrystalline silicon diaphragm.

2. The method as claimed in claim 1, wherein the diaphragm silicon substrate is a monocrystalline silicon substrate, or the diaphragm silicon substrate comprises a silicon device layer of an SOI wafer.

3. The method as claimed in claim 1, wherein, in Step 1, the holes in the center area are formed by DRIE processes.

4. The method as claimed in claim 1, wherein, in Step 5, the monocrystalline silicon diaphragm is etched by RIE.

5. The method as claimed in claim 1, wherein Step 6 further comprises:

depositing a silicon rich nitride layer covering upper surface of the second dielectric layer, the upper surface of the monocrystalline silicon diaphragm, and the bottoms and sidewalls of the second through holes, the silicon rich nitride layer filling the spring structure slots and the first through holes;

etching parts of the silicon rich nitride layer to form the remaining portion which is at the bottoms and sidewalls of the second through holes, and covers parts of upper surface of the diaphragm adjacent to the second through holes, so as to form the bumps.

* * * * *